(12) United States Patent
Wilson et al.

(10) Patent No.: US 12,061,099 B2
(45) Date of Patent: Aug. 13, 2024

(54) APPARATUS AND METHOD OF PRODUCING A SENSING SUBSTRATE

(71) Applicant: Joyson Safety Systems Acquisition LLC, Auburn Hills, MI (US)

(72) Inventors: David Wilson, Clarkston, MI (US); David Haggitt, Lake Orion, MI (US)

(73) Assignee: Joyson Safety Systems Acquisition LLC, Auburn Hills, MI (US)

( * ) Notice: Subject to any disclaimer, the term of this patent is extended or adjusted under 35 U.S.C. 154(b) by 0 days.

(21) Appl. No.: 18/222,813

(22) Filed: Jul. 17, 2023

(65) Prior Publication Data

US 2023/0358570 A1 Nov. 9, 2023

Related U.S. Application Data

(63) Continuation of application No. 17/133,777, filed on Dec. 24, 2020, now Pat. No. 11,719,557.

(Continued)

(51) Int. Cl.
*G01D 5/16* (2006.01)
*B60N 2/00* (2006.01)
(Continued)

(52) U.S. Cl.
CPC .............. *G01D 5/16* (2013.01); *B60N 2/002* (2013.01); *G01D 5/2417* (2013.01); *H05K 1/028* (2013.01)

(58) Field of Classification Search
CPC .......... H05K 1/02; H05K 1/028; H05K 1/162; H05K 1/167; H05K 2201/09681;
(Continued)

(56) References Cited

U.S. PATENT DOCUMENTS

| 5,905,210 A | 5/1999 | O'Boyle et al. |
| 5,918,696 A | 7/1999 | VanVoorhies |

(Continued)

FOREIGN PATENT DOCUMENTS

| CN | 1702439 A | 11/2005 |
| DE | 19848615 A1 | 5/1999 |

(Continued)

OTHER PUBLICATIONS

International Search Report and Written Opinion issued for Application No. PCT/US2020/067006, dated Apr. 15, 2021, in U.S. Appl. No. 17/133,777 file folder.

(Continued)

*Primary Examiner* — Eman A Alkafawi
*Assistant Examiner* — Suresh K Rajaputra
(74) *Attorney, Agent, or Firm* — Meunier Carlin & Curfman LLC

(57) ABSTRACT

An occupant or object sensing system in a vehicle includes electrical circuits for resistive and/or capacitive sensing and corresponding circuits shielding the sensing system from interference. A sensing circuit and a shielding circuit may be printed by screen printing with conductive ink on opposite sides of a non-conductive substrate. The substrate is a plastic film or other fabric that has an elastic memory structure that is resilient to stretching. The conductive inks used to print circuits onto the substrate have a similar resilience to stretching such that the substrate and the circuits thereon can be subject to deforming forces without breaking the printed circuits. The substrate may be covered with a carbon polymer layer to provide alternative conductive paths that enable fast recovery for conduction in the presence of any break in the printed conductive traces on the substrate.

21 Claims, 11 Drawing Sheets

Related U.S. Application Data

(60) Provisional application No. 62/953,294, filed on Dec. 24, 2019.

(51) Int. Cl.
*G01D 5/241* (2006.01)
*H05K 1/02* (2006.01)

(58) Field of Classification Search
CPC ............ H05K 2201/10151; G01D 5/16; G01D 5/241; G01D 5/2417; B60N 2/00; B60N 2/002; B60N 2/79
See application file for complete search history.

(56) References Cited

U.S. PATENT DOCUMENTS

| | | | |
|---|---|---|---|
| 5,927,427 | A | 7/1999 | Sewell et al. |
| 5,957,491 | A | 9/1999 | Cech et al. |
| 5,979,585 | A | 11/1999 | Van Voorhies |
| 5,984,349 | A | 11/1999 | Van Voorhies |
| 5,986,221 | A | 11/1999 | Stanley |
| 5,997,033 | A | 12/1999 | Hill et al. |
| 6,021,863 | A | 2/2000 | Stanley |
| 6,045,155 | A | 4/2000 | Cech et al. |
| 6,056,079 | A | 5/2000 | Cech et al. |
| 6,069,325 | A | 5/2000 | Aoki et al. |
| 6,076,853 | A | 6/2000 | Stanley |
| 6,109,117 | A | 8/2000 | Stanley et al. |
| 6,250,671 | B1 | 6/2001 | Osmer et al. |
| 6,323,443 | B1 | 11/2001 | Aoki et al. |
| 6,323,444 | B1 | 11/2001 | Aoki |
| 6,342,683 | B1 | 1/2002 | Aoki et al. |
| 6,360,615 | B1 | 3/2002 | Smela |
| 6,407,347 | B1 | 6/2002 | Blakesley |
| 6,571,647 | B1 | 6/2003 | Aoki et al. |
| 6,586,948 | B1 | 7/2003 | Aoki et al. |
| 6,617,531 | B1 | 9/2003 | Aoki |
| 6,677,538 | B2 | 1/2004 | Cook et al. |
| 6,689,960 | B2 | 2/2004 | Aoki et al. |
| 6,841,741 | B2 | 1/2005 | Hiroshi |
| 6,959,779 | B2 | 11/2005 | Curtis et al. |
| 7,055,365 | B2 | 6/2006 | Eiji |
| 7,061,389 | B2 | 6/2006 | Tomotoshi |
| 8,012,360 | B1 | 9/2011 | Sippola |
| 10,018,615 | B2 | 7/2018 | Qian et al. |
| 11,001,167 | B2 * | 5/2021 | Wilson ................. G01D 5/2417 |
| 11,719,557 | B2 * | 8/2023 | Wilson ................. G01D 5/2417 |
| | | | 324/686 |
| 2001/0010424 | A1 | 8/2001 | Osmer et al. |
| 2002/0024205 | A1 | 2/2002 | Curtis et al. |
| 2002/0038947 | A1 | 4/2002 | Baba et al. |
| 2002/0171540 | A1 | 11/2002 | Ando et al. |
| 2003/0090133 | A1 | 5/2003 | Nathan et al. |
| 2003/0090376 | A1 | 5/2003 | Thompson et al. |
| 2003/0204295 | A1 | 10/2003 | Thompson et al. |
| 2004/0041377 | A1 | 3/2004 | Kumakiri et al. |
| 2004/0066023 | A1 | 4/2004 | Joseph |
| 2004/0079176 | A1 | 4/2004 | Sullivan et al. |
| 2004/0262049 | A1 | 12/2004 | Tomotoshi et al. |
| 2004/0262050 | A1 | 12/2004 | Tomotoshi |
| 2004/0262956 | A1 | 12/2004 | Senoo |
| 2005/0011682 | A1 | 1/2005 | Murphy |
| 2005/0022615 | A1 | 2/2005 | Fortune et al. |
| 2005/0023045 | A1 | 2/2005 | Yoshida |
| 2005/0027418 | A1 | 2/2005 | Murphy |
| 2005/0039456 | A1 | 2/2005 | Tetsumei et al. |
| 2005/0156726 | A1 | 7/2005 | Rubel |
| 2005/0264046 | A1 | 12/2005 | Hiroaki |
| 2005/0264051 | A1 | 12/2005 | Lawall et al. |
| 2005/0288829 | A1 | 12/2005 | Sakai et al. |
| 2006/0217862 | A1 | 9/2006 | Sakai et al. |
| 2007/0083311 | A1 | 4/2007 | Tabe |
| 2008/0012276 | A1 | 1/2008 | Sugawara et al. |
| 2008/0073130 | A1 | 3/2008 | Bulgajewski et al. |
| 2010/0117845 | A1 | 5/2010 | Satz et al. |
| 2010/0152975 | A1 | 6/2010 | Nakagawa et al. |
| 2010/0324774 | A1 | 12/2010 | Bouni et al. |
| 2011/0012402 | A1 | 1/2011 | Inayoshi et al. |
| 2011/0029203 | A1 | 2/2011 | Watson et al. |
| 2011/0040451 | A1 | 2/2011 | Lee et al. |
| 2012/0025966 | A1 | 2/2012 | Nakanishi et al. |
| 2013/0218487 | A1 | 8/2013 | Fujii et al. |
| 2014/0188347 | A1 | 7/2014 | Tabe |
| 2015/0127224 | A1 | 5/2015 | Tabe |
| 2015/0158447 | A1 | 6/2015 | Nonaka |
| 2015/0175111 | A1 | 6/2015 | Muramatsu |
| 2016/0304045 | A1 | 10/2016 | Cuddihy et al. |
| 2017/0088097 | A1 | 3/2017 | Hosokawa et al. |
| 2017/0113573 | A1 | 4/2017 | Fujii et al. |
| 2017/0129365 | A1 | 5/2017 | Fujii et al. |
| 2017/0305301 | A1 * | 10/2017 | McMillen ............. B60N 2/002 |
| 2017/0325525 | A1 | 11/2017 | Hyde et al. |
| 2017/0326013 | A1 | 11/2017 | Hyde et al. |
| 2018/0022233 | A1 | 1/2018 | Maguire et al. |
| 2018/0093630 | A1 | 4/2018 | Koike |
| 2018/0184735 | A1 | 7/2018 | Longinotti-Buitoni et al. |
| 2019/0132948 | A1 | 5/2019 | Longinotti-Buitoni et al. |
| 2019/0156971 | A1 | 5/2019 | Brink et al. |
| 2020/0391616 | A1 | 12/2020 | Wilson |

FOREIGN PATENT DOCUMENTS

| | | |
|---|---|---|
| DE | 69929104 T2 | 7/2006 |
| DE | 102017205135 | 9/2018 |
| EP | 0990565 A1 | 4/2000 |
| JP | H11304579 A | 5/1999 |
| JP | H11351952 A | 12/1999 |
| JP | 2000180255 A | 6/2000 |
| JP | 2000258232 A | 9/2000 |
| JP | 2000258234 A | 9/2000 |
| JP | 2001041813 A | 2/2001 |
| JP | 2001108513 A | 4/2001 |
| JP | 2001150997 A | 6/2001 |
| JP | 2002267524 A | 9/2002 |
| JP | 2003177052 A | 6/2003 |
| JP | 2004205410 A | 7/2004 |
| JP | 2005024289 A | 1/2005 |
| JP | 2005037356 A | 2/2005 |
| JP | 2005037357 A | 2/2005 |
| JP | 2005037358 A | 2/2005 |
| JP | 2006003146 A | 1/2006 |
| KR | 1020110106706 | 9/2011 |
| WO | 2017029603 | 2/2017 |
| WO | 2018011464 | 1/2018 |
| WO | 2019010473 | 1/2019 |
| WO | 2019138153 | 7/2019 |

OTHER PUBLICATIONS

Data Acquisition Systems Engineering. The Twists of Strain Gauge Measurements, part 1 and part 2. Posted on-line, Aug. 2, 2013, 3 pages. https://ueidag.wordpress.com/2013/08/02/the-twists-of-strain-gauge-measurements-part-1/, in U.S. Appl. No. 17/133,777 file folder, https://ueidaq.wordpress.com/2013/08/08/strain-gauge-measurements-part-2/.

Maddipatla, Dinesh, "Development of Fully Printed and Flexible Strain, Pressure and Electrochemical Sensors" (Dec. 2016). Master's Theses. 750. 95 pages. http://scholarworks.wmich.edu/masters_theses/750, in U.S. Appl. No. 17/133,777 file folder.

Moorthi, A., et al. "A novel flexible strain gauge sensor fabricated using screen printing." 2012 Sixth International Conference on Sensing Technology (ICST). IEEE, 2012, 4 pages, in U.S. Appl. No. 17/133,777 file folder.

Yamada, t., et al., "A stretchable carbon nanotube strain sensor for human-motion detection", Nat. Nanotech., vol. 6, pp. 296-301, 2011, in U.S. Appl. No. 17/133,777 file folder.

* cited by examiner

APPARATUS AND METHOD OF PRODUCING A SENSING SUBSTRATE

CROSS REFERENCE TO RELATED APPLICATIONS

This application claims priority to and incorporates by reference U.S. Provisional Patent Application Ser. No. 62/953,294 filed on Dec. 24, 2019, and entitled Apparatus and Method of Producing a Sensing Substrate.

BACKGROUND

Current implementations of capacitive sensing and resistive sensing technologies are often configured for placing on, within, or around automobile components, such as steering wheels and the like, or possibly within a vehicle seat. For example, conductive objects, like a human body, can induce electrical responses, either resistive or reactive, in the sensing systems that are useful for occupant detection. An occupant detection system may comprise one or both of a seat weight sensor that can use resistance measurements to calculate weight affecting the sensor and an electric field sensor that can calculate presence, position, and certain identifying features of an occupant or an occupant's location in the vehicle. Each of these sensors is operatively connected to a controller for monitoring vehicle occupancy.

In earlier known embodiments, the seat weight sensor has been adapted to generate a measure of weight upon the vehicle seat, e.g., upon the associated seat bottom. Similarly, the electric field sensor may include at least one electrode located, for example, in the seat bottom under the seat cover and close to the top of a foam cushion. The electric field sensor is adapted to enable detection and classification of a type of occupant or object that may be upon the seat bottom of the vehicle seat.

Traditional capacitive sensors and their associated shielding systems are often layered assemblies that include a sensor mat, a shielding layer, and/or a heating mat that collectively allow for physical detection of an occupant's body, an occupant's position in a vehicle, or placement of an object in a vehicle. Generally, in prior embodiments, a power source provides a voltage signal to a shield mat to provide electrical shielding for a sensor mat. Interference with the electrical signal(s) carried by the sensor mat may occur due to the proximity of the sensor mat to a metal object such as a steering wheel or seat frame, and providing the shielding voltage signal to the shield mat reduces or prevents this interference with desirable electric field measurements. In addition, the system may also include a heater mat. The heater mat may be separate from the shield mat or it may be used as a combination heater and shielding mat. To use the heater mat as a shield mat, the power source generates a heating current for heating or the shielding voltage signal for using the heater mat as a shield mat. The heating current is typically greater than a shielding current.

As used herein, the term "electric field sensor" refers to a sensor that generates a signal responsive to the influence of that being sensed upon an electric field. Generally, an electric field sensor comprises at least one electrode to which is applied at least one applied signal and at least one electrode—which could be the same electrode or electrodes to which the applied signal is applied—at which a received signal (e.g., capacitive response or change in resistance) is measured. In operation, the applied signal generates an electric field from the at least one electrode to a ground in the environment of the at least one electrode, or to another at least one electrode. The applied and received signals can be associated with the same electrode or electrodes, or with different electrodes. The particular electric field associated with a given electrode or set of electrodes is dependent upon the nature and geometry of the electrode or set of electrodes and upon the nature of the surroundings thereto, for example, the dielectric properties of the surroundings. For a fixed electrode geometry, the received signal or signals of an electric field sensor are responsive to the applied signal or signals and to the nature of the environment influencing the resulting electric field, for example to the presence and location of an object having a permittivity or conductivity different from that of its surroundings.

One form of electric field sensor is a capacitive sensor, wherein the capacitance of one or more electrodes is measured—from the relationship between received and applied signals—for a given electrode configuration. What has commonly been referred to as capacitive sensing actually comprises the distinct mechanisms of what those in the art refer to as "loading mode," "shunt mode", and "transmit mode" which correspond to various possible electric current pathways. In the "shunt mode", a voltage oscillating at low frequency is applied to a transmit electrode, and the displacement current induced at a receive electrode is measured with a current amplifier, whereby the displacement current may be modified by the body being sensed. In the "loading mode", the object to be sensed modifies the capacitance of a transmit electrode relative to ground. In the "transmit mode", the transmit electrode is put into circuit transmission with the user's body, which then becomes a transmitter relative to a receiver, either by direct electrical connection or via capacitive coupling.

Accordingly, the electric field sensor is either what is commonly known as a capacitive sensor, or more generally an electric field sensor operating in any of the above described modes. The electric field sensor comprises at least one electrode operatively coupled to at least one applied signal so as to generate an electric field proximate to the at least one electrode, responsive to the applied signal. The applied signal, for example, comprises either an oscillating or pulsed signal. At least one electrode is operatively coupled to a sensing circuit that outputs at least one response signal responsive to the electric field at the corresponding electrode wherein the response signal is responsive to at least one electric-field-influencing property—for example, dielectric constant, conductivity, size, mass or distance—of an object proximate to the electric field sensor. For example, for the electric field sensor operating as a capacitance sensor, the sensing circuit measures the capacitance of at least one electrode with respect to either another electrode or with respect to a surrounding ground, for example, a seat frame of the vehicle seat, connected to circuit ground. The at least one applied signal is, for example, generated by the sensing circuit that also outputs the at least one response signal. The sensing circuit and associated applied signal may be adapted to be responsive to the influence of a water-soaked vehicle seat, on measurements from the electric field sensor.

Stated in another way, the electric field sensor has a relatively short range and principally senses an occupant when a large surface of the occupant is relatively close to the sensor. Occupants normally seated directly on the seat cover typically have a large surface of their body relatively close to the electrode. When infants or children are in child seats, most of their body is elevated several inches off the seat bottom surface, resulting in a relatively small influence upon the electric field sensor. The electric field sensor in the seat bottom distinguishes between types of occupants in a seat.

For example, a large body immediately above the seat cover—for example a normally seated, forward facing adult occupant in the seat induces a capacitive response that is distinguishable from an infant or child seat, including rear facing, front facing and booster seats that are often located on a vehicle seat. In at least one prior art embodiment, when the vehicle seat contains a child seat (including a rear facing infant seat, a forward facing child seat and a booster seat), or when the vehicle seat is empty, no forward facing occupant is detected near to the seat bottom and, as a result, the electric field sensor may be connected to other vehicle systems causing a restraint actuator, such as an ignitor in a vehicle air bag, to be disabled.

The above described technology has also been incorporated in occupant classification systems using a single circuit as both a heater and a sensor. The seat may include a heater controller to regulate the heaters in the seat bottom and/or the seat back and an electronic control unit (ECU) coupled to the sensors in the seat bottom and/or seat back are configured to detect and categorize an object or occupant in the seat. The ECU may include sensing and measurement circuits. If the sensor is integrated into the heater system, the heater controller and the ECU may be connected in series such that power and/or control signals may be provided to the conductor (i.e., sensing and heater device) by, for example, the heater controller through the ECU. While the heater controller and the ECU are often provided under the seat bottom of a vehicle, in various embodiments the heater controller may be provided elsewhere in the vehicle.

Up to now, the Occupant Classification Systems of the prior art have depended upon either the above noted capacitive sensing methods or a seat weight rail system. A seat weight rail system measures deflection of the seat rails and determines a weight on the seat. This gives 5 states of measurement: 1 yo, 3 yo, 6 yo, 5th female, 50th male. This system is expensive and heavy (a concern for electric vehicles).

Embodiments of an Occupant Classification System using seat weight rail systems, capacitive sensing, and heater as a sensor embodiments have been heavily scrutinized by regulatory bodies in the United States and abroad. For example, in the United States, Federal Motor Vehicle Safety Standards No. 208 (FMVSS 208) has recognized deficiencies in the use of capacitive sensing and heater as a sensor embodiments for occupant classification. In particular, these prior embodiments do not adequately provide clear occupant classification distinctions between vehicle occupants that, with the technology described above, must be grouped together. For example, in the case of capacitive sensing, the system is not accurate enough to provide classification beyond "large" (e.g., 5th percentile sized female and larger) and "small" (infant or empty vehicle seat). A system of occupant classification, using capacitive sensing, for example, may distinguish a general division in classes with infant-female separation in weight classes providing the only classification threshold. This threshold, however, does not provide the best resolution to distinguish the characteristics of occupants within the large and small categories.

Infant-Female separation is a weight-based measurement system using capacitance as described above but only provides a two-state solution. Several publicly available charts promulgated by the National Highway Traffic Safety Administration show how the United States regulation FMVSS 208 has mapped certain un-identifiable and non-classifiable grey zones in traditional occupant classification systems, namely a system using a heater as a sensor technology for capacitive sensing. The grey zones in these public documents reflect that currently used occupant systems are largely ineffective to determine physical characteristics, and associated safety protocols, when occupants are between the traditional small and large classifications (e.g., small adults sized larger than a six-year old child and smaller than a $5^{th}$ percentile female, as well as adults sized between $5^{th}$ percentile females and $50^{th}$ percentile males).

In other embodiments of relevant technology, the seat weight sensor is responsive to a force upon the vehicle seat. The seat weight sensor, for example, may comprise one or more load cells operatively coupled to at least one load path between the seat bottom and the vehicle, e.g. between the seat frame and the floor pan of the vehicle, e.g. at the corners of the seat frame, so as to measure the weight of the entire vehicle seat and objects or occupants placed thereon. For example, the one or more load cells could use a strain gauge, a magnetic-restrictive sensing element, a force sensitive resistive element, or another type of sensing element to measure the associated load. For example, the seat weight sensor may be constructed in accordance with the teachings of U.S. Pat. Nos. 5,905,210, 6,069,325 or 6,323,444, each of which is incorporated herein by reference.

The seat weight sensor may alternately comprise at least one mass sensing element, e.g. a force sensitive resistive element, a membrane switch element, a pressure sensitive resistive contact, a pressure pattern sensor, a strain gauge, a bend sensor, or a hydrostatic weight sensing element, operatively coupled to one or more seating surfaces in the seat base or seat back, e.g. in accordance with the teachings of U.S. Pat. Nos. 5,918,696, 5,927,427, 5,957,491, 5,979,585, 5,984,349, 5,986,221, 6,021,863, 6,045,155, 6,076,853, 6,109,117 or 6,056,079, each of which is incorporated herein by reference. Currently there are hundreds of patents with regards to measuring the weight of a seat with a seated occupant. The patents also include or reference using the output of said sensor to classify an occupant as a child, 5th female, or 50th male for the purpose of tailoring actions or reactions of an automotive safety system. A small sample of the state of the art include patents and patent applications originating with the applicant assignee of this disclosure, such as but not limited to U.S. patent application Ser. No. 16/442,209; U.S. Patent Pub. No. 2018/0022233, U.S. Pat. No. 6,342,683B1, DE69929104T2, JPH11304579A, JP2000258232A, JP2002267524A, JP2001150997A, JPH11351952A, JP2000180255A, JP2004205410A, JP2003177052A, JP2001041813A, JP2006003146A, JP2000258234A, EP0990565A1, JP2005037357A, JP2005037358A, JP2005037356A, JP2001108513A, CN1702439A, JP2005024289A, U.S. Pat. No. 6,571,647B1, US20040262956A1, U.S. Pat. No. 6,617,531B1. All of the patents and patent publications referenced herein are incorporated by reference as if set forth in their entirety herein.

Problems arise in the above described technologies, however, when layered assemblies are too thick or bulky for installing in conjunction with various components of a vehicle, or the materials used in the layers are not amenable to forming into a desirable shape for a given application. Accordingly, there is a need in the art for improved systems and methods for making resistive sensor systems and capacitive sensor systems such that the sensors can be placed in more diverse areas of a vehicle body. Of course, all improvements to the structures of a capacitive sensing system must still reliably provide changes in electrical outputs that can be used for numerous occupant detection and occupant safety purposes.

BRIEF SUMMARY

A seat assembly for a vehicle includes a deformable seat surface connected to a seat frame and a flexible substrate connected to the deformable seat surface. At least one conductive ink trace is positioned on the flexible substrate, and the conductive ink trace is configured to bend in response to a deforming load applied to at least a portion of the conductive ink trace. The conductive ink trace has an electrical resistance that fluctuates according to a degree of deformation of the conductive ink trace in response to the bend.

One non-limiting implementation of capacitive sensing technologies according to this disclosure is a sensor system that includes a sensor circuit construction configured for placement in or on multiple structures within the interior of a vehicle. A circuit construction may include a base substrate, layer or sheet that allows for constructing a resistive sensor circuit and a capacitive sensor circuit on a first side of the substrate. A second side of the substrate supports a shield circuit thereon such that the sensing and shielding operations of the overall sensor system include a minimal number of layers to install. In fact, by utilizing printing operations and conductive ink products, both of the sensor circuits and the shield circuit can be formed on opposite sides of a single layer (i.e., a single substrate).

In one non-limiting embodiment, a sensor for occupant monitoring in a vehicle includes a flexible substrate that is resilient to a deforming load thereon. A plurality of conductive traces are on the flexible substrate, and the conductive traces are configured for bending in response to the deforming load applied to the flexible substrate and the conductive traces. A resistive sensor circuit is on a first side of the flexible substrate, and the resistive sensor circuit includes a respective set of the conductive traces, wherein the resistive sensor circuit has an electrical resistance that fluctuates according to a degree of deformation of the respective set of the conductive traces in response to the bending.

In another embodiment, a seat assembly for a vehicle includes a deformable seat surface connected to a seat frame. A flexible substrate is positioned in proximity to the deformable seat surface in a position that a deforming load on the deformable seat surface transfers to the flexible substrate. At least one conductive ink trace is on the flexible substrate, and the at least one conductive ink trace is configured to bend in response to the deforming load applied to at least a portion of the at least one conductive ink trace. At least one conductive ink trace has an electrical resistance that fluctuates according to a degree of deformation of the at least one conductive ink trace in response to the bend.

A system of occupant detection in a seat assembly of a vehicle includes a deformable seat surface connected to a seat frame. A flexible substrate is positioned to receive a deforming load from the deformable seat surface. At least one conductive ink trace is on the flexible substrate, and the conductive ink trace is configured to bend in response to a deforming load applied to at least a portion of the conductive ink trace. The conductive ink trace has an electrical resistance that fluctuates according to a degree of deformation of the conductive ink trace in response to the bend. A voltage source in electrical communication with a first end of said conductive ink trace. A computer having a processor and memory in data communication with the opposite end of the conductive ink trace, wherein the computer measures a change in resistance of the conductive ink trace due to the bend, and the computer is configured to classify the change in resistance as corresponding to a magnitude of the deforming load.

In another embodiment, a sensor for occupant monitoring in a vehicle includes a flexible substrate in proximity to a deformable seat surface. A plurality of conductive traces are positioned on the flexible substrate, and the conductive traces are configured to bend in response to a deforming load that is applied to the deformable seat surface and transferred through the deformable seat surface to at least a portion of the conductive traces. At least a first of the conductive traces form a resistive sensor circuit on a first side of the flexible substrate, wherein the resistive sensor circuit has an electrical resistance that fluctuates according to a degree of deformation of the conductive ink trace in response to the bend. A voltage source is in electrical communication with a first end of the conductive traces. A computer has a processor and memory in data communication with the opposite end of the conductive ink traces, wherein the computer measures a change in resistance of the resistive sensor circuit due to the bend, and the computer is configured to classify the change in resistance as corresponding to a magnitude of the deforming load.

BRIEF DESCRIPTION OF THE DRAWINGS

The components in the drawings are not necessarily to scale relative to each other. Like reference numerals designate corresponding parts throughout the several views.

DETAILED DESCRIPTION

Apparatuses, systems and methods of electronically sensing occupants and other objects within a vehicle, along with appropriate shielding mechanisms to account for electrical interference, are disclosed herein. The concepts described herein are equally applicable to occupant and object sensing technologies that can be placed within or proximate to any vehicle component that would benefit from electronic sensing, associated shielding functions, and computerized analysis techniques that provide control data to vehicle data management systems. Terms used in this disclosure, therefore, are intended to imply their broadest meaning. For example, references to "vehicles" include all forms of transportation apparatuses in which occupants move from one destination to another. In fact, certain physical implementations of a sensing system may be useful in numerous kinds of electronic sensing environments, and the term "capacitive" sensing is not intended to be the sole technology sector that can utilize the structures described below.

Figure 1A:
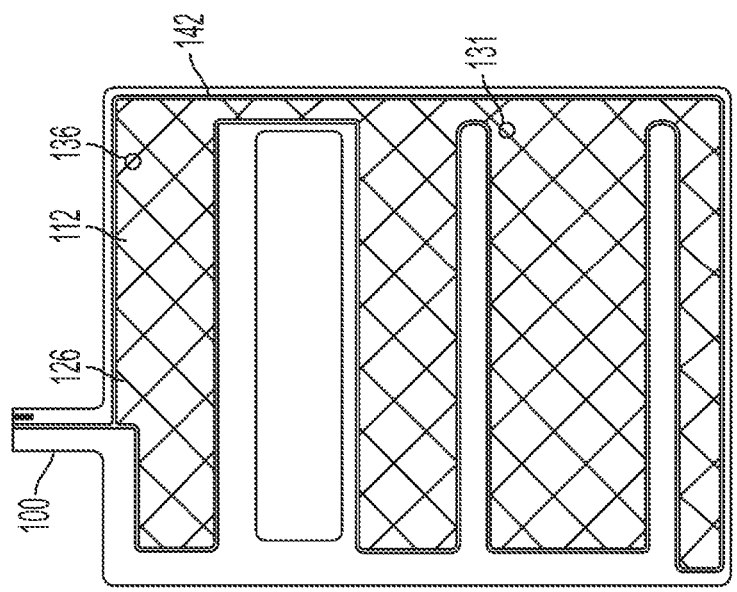
FIG. 1A illustrates a plan view of a first side of a sensor substrate according to one implementation of this disclosure.
Figure 1B:
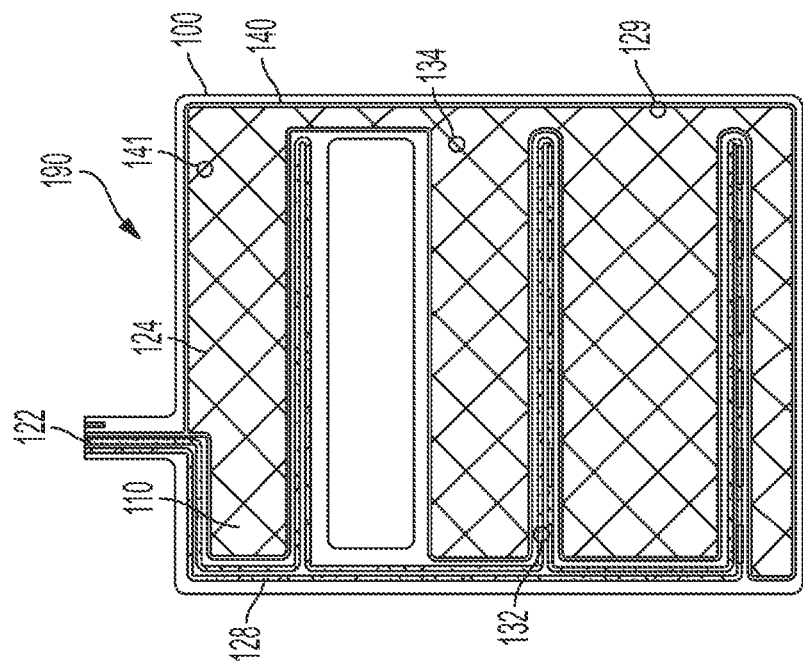
FIG. 1B illustrates a plan view of a second side of a sensor substrate according to one implementation of this disclosure.

One non-limiting implementation of capacitive sensing technologies is a sensor system shown in FIGS. 1A and 1B that includes a sensor circuit construction 190 configured for placement in or on multiple structures within the interior of a vehicle. As illustrated in FIG. 1A, a circuit construction 190 may include a base substrate, layer or sheet 100 that allows for constructing a resistive sensor circuit 122 and a capacitive sensor circuit 124 on a first side 110 of the substrate 100. A second side 112 of the substrate 100 supports a shield circuit 126 thereon such that the sensing and shielding operations of the overall sensor system include a minimal number of layers to install. In fact, by utilizing printing operations and conductive ink products, both of the sensor circuits 122, 124 and the shield circuit 126 can be formed on opposite sides 110, 112 of a single layer (i.e., a single substrate 100).

Another way to describe the embodiment of FIGS. 1A and 1B is that a circuit construction 190 for placing in a sensing system within a vehicle includes a non-conductive sheet 100 having a first planar face 140 and a second planar face 142, corresponding to the respective first side 110 and second side 112. Respective conductive traces 132, 134, and 136 are printed onto and/or otherwise adhered to the first planar face 140 and the second planar face 142 of the substrate 100. In one embodiment described below, the conductive traces may be screen printed onto the opposite sides 110, 112 of the substrate in a silver polymer ink as illustrated in FIGS. 1A and 1B. In non-limiting examples, the substrate 100 may be formed as a sheet of a thin nylon fabric that is between 0.10 mm and 0.2 mm thick.

The conductive traces described herein may be between 0.008 mm and 0.015 mm thick, with endpoints of the range included. In fact, the conductive traces may within a range of 0.008 mm to 0.020 mm thick and provide appropriate functionality.

One non-limiting goal of the described embodiments is to provide a sensing and shielding structure that can be positioned within hard-to-fit vehicle components of numerous shapes, contours, and sizes inside a vehicle. To accomplish this goal, the substrate 100 and the conductive traces 132, 134, and 136 each comprise flexible compositions with a mutual resilience that allows the substrate and the traces to stretch and contract in conjunction with one another. The term mutual resilience is intended for descriptive purposes only, but in general, the extent of resilience of the substrate 100 and the corresponding resilience of the electrically conductive traces 132, 134, and 136 are engineered to maintain structural and electrical continuity of the conductive traces in the presence of deforming forces being exerted upon the sheet and then released in repetitive fashion. The substrate 100 and the conductive traces 132, 134, and 136 are designed with stretching parameters that overlap so that deforming forces cannot stretch or contract the overall circuit construction 190 in a manner that breaks stretching limits for either or both of the sheet or substrate 100 and the conductive traces 132, 134, and 136 thereon. In other words, the substrate 100 can be molded, shaped, folded, and most importantly, stretched to comply with design considerations without breaking the circuits formed by the conductive traces 132, 134, and 136. The sheet and the conductive traces are configured to withstand deforming forces that stretch a dimension of the sheet in any direction by an amount between 2 percent and 10 percent.

Figure 2:
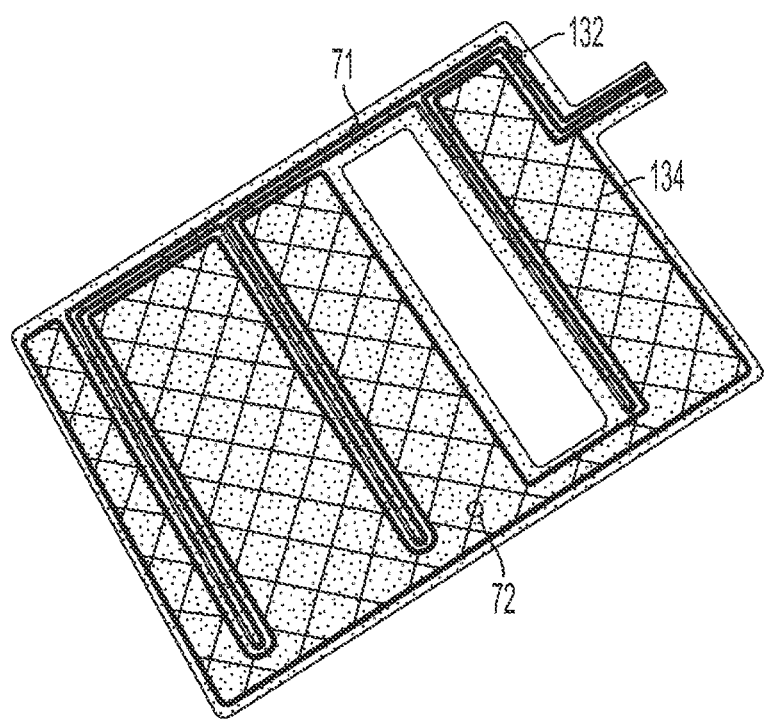
FIG. 2 illustrates a front perspective view of an assembled sensor substrate according to one embodiment of this disclosure.
Figure 3:
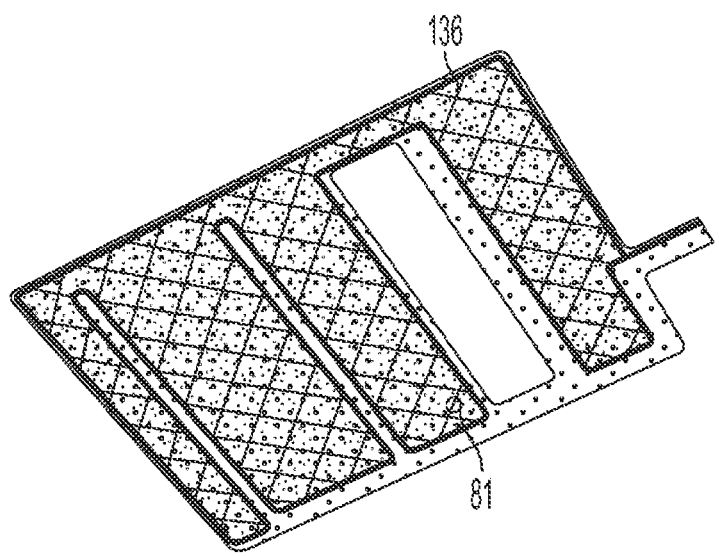
FIG. 3 illustrates a rear plan view of an assembled sensor substrate according to one embodiment of this disclosure.
Figure 6A:
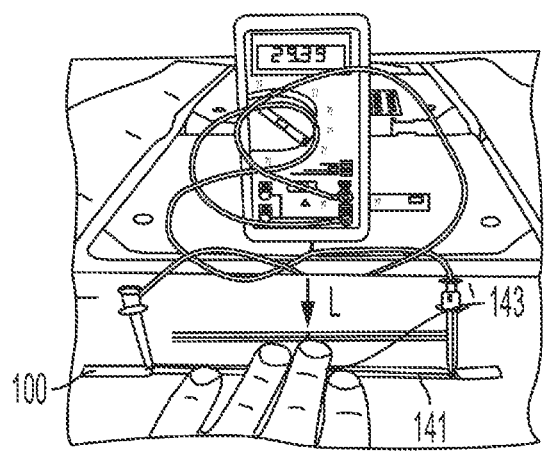
FIG. 6A illustrates a perspective view of an example circuit pattern printed onto a sensor mat and subject to a force thereon according to one implementation.

FIGS. 2 and 3 illustrate embodiments of this disclosure by which the conductive traces 132, 134, and 136 may be configured as bendable conductive traces that stretch, compress, and bend in response to load forces (L) exerted thereon. The bendable conductive traces also exhibit corresponding electrical and electromagnetic properties in accordance with the bend. As shown by circuit test equipment in FIGS. 6A and 6B, the bendable conductive traces 141 may be positioned on a substrate 100 and then used for identifying changes in the bendable conductive trace's resistance, current flow, capacitive effects, and other electrical or electromagnetic responses to outside loading forces 143. The bendable conductive traces 141 may be installed as noted above to form a sensing system using circuit construction 190 on a substrate 100 and includes a resistive sensor trace 128 and a capacitive sensor trace 129 on one side and a shield sensor trace 131 on an opposite side.

FIGS. 1-3 illustrate that conductive traces 132, 134, and 136 which can be configured as bendable conductive traces 141 on opposite sides of the substrate 100, as well as the substrate, or sheet itself, can have length, width and height dimensions along x, y, and z axes respectively. Accordingly, the mutual resilience between the non-conductive substrate 100 and the respective conductive traces 132, 134, and 136 on opposite sides 110, 112 of the substrate 100 give the circuit construction 190 a memory shape effect, allowing the entire circuit construction 190 to be subject to stretching, contracting, or other deforming forces along the axes without breaking the conductive traces and the resulting shielding and sensing circuits.

Figure 4A:
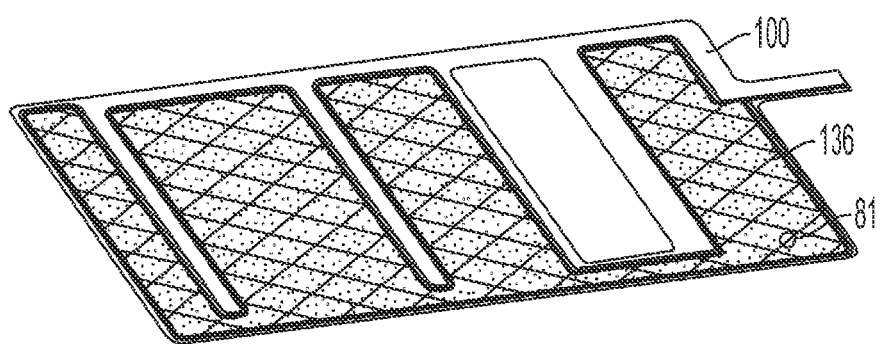
FIG. 4A illustrates a rearward perspective view of a cross section across the z-axis (thickness) of an assembled sensor substrate according to one embodiment of this disclosure.
Figure 4B:
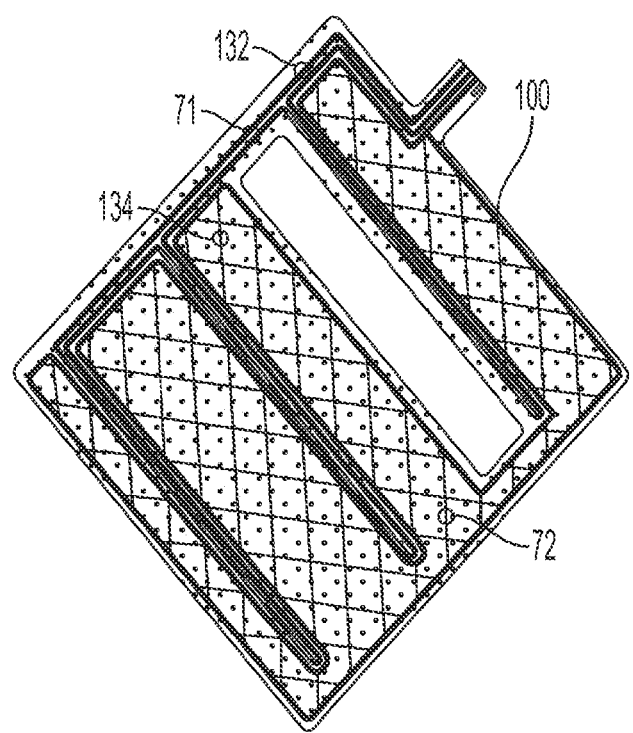
FIG. 4B illustrates a frontward perspective view of a cross section across the z-axis (thickness) of an assembled sensor substrate according to one embodiment of this disclosure.

FIGS. 4A and 4B are cross section illustrations of a substrate 100, illustrated as being transparent for example purposes, and the cross sections are taken through the z-axis (i.e, across the thickness of the substrate 100). FIGS. 4A and 4B, therefore, show that the conductive traces 132 for the resistive sensor circuit 122 and conductive traces 134 for the capacitive sensor circuit 124 define a first pattern 71 (resistive) and a second pattern 72 (capacitive) on the first side 110 of the non-conductive substrate 100 and a third pattern 81 (shielding) on the second side 112 of the sheet 100. In other embodiments, the patterns 71, 72, 81 may be similar or even identical. In one non-limiting example, the conductive traces 132, 134, and 136 on the opposite faces of the sheet substrate 100 operate similarly to separate sensor mats and shielding mats of multi-layered capacitive sensing devices, but with much more flexibility in design and more possible uses that require space saving efficiency not seen in prior devices.

Figure 5:
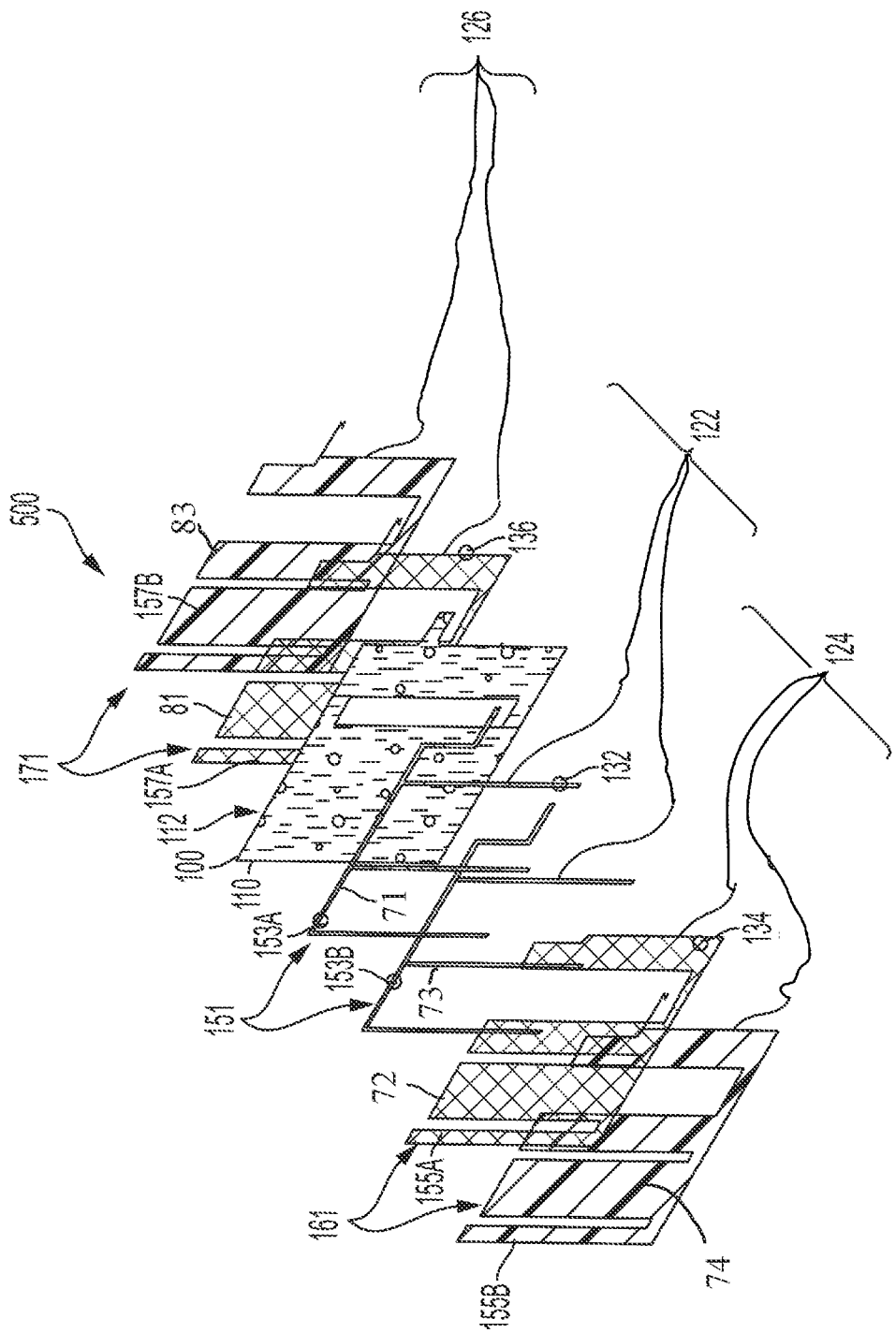
FIG. 5 illustrates a perspective view of a first example of layers of circuit patterns printed onto a sensor mat according to one implementation of this disclosure.
Figure 7:
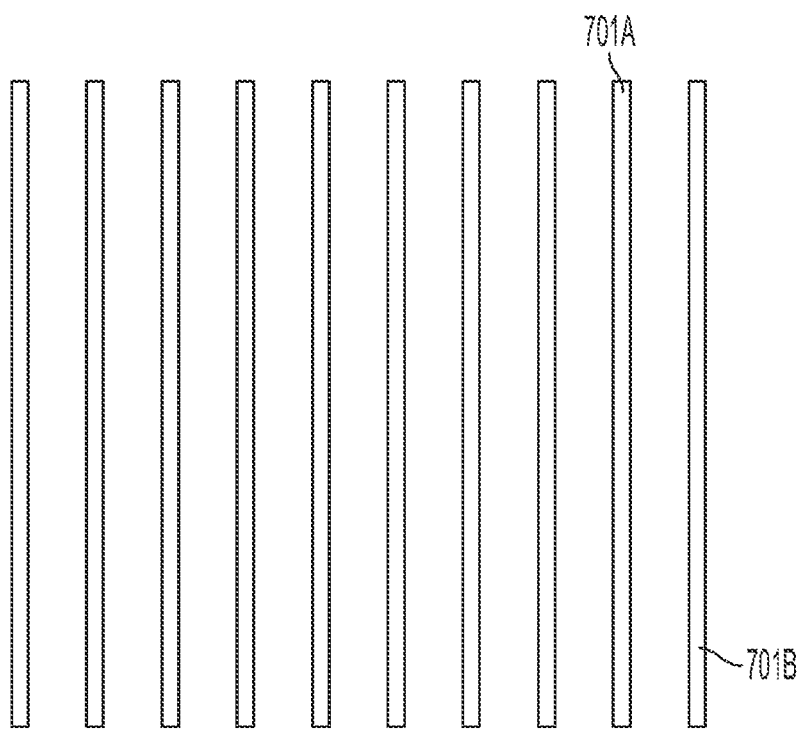
FIG. 7 illustrates a schematic diagram of a sensor substrate having interleaved conductors for sensing and shielding operations according to the embodiments herein.

In one non-limiting embodiment, FIG. 5 illustrates an exploded view of a sensor system circuit construction 190 according to this disclosure. The exploded view is not limiting of this disclosure but does illustrate one example implementation of how printed metallic (e.g., mesh-like) layers fit on opposite sides of the substrate 100 to accomplish the sensing operations, shielding functions, and even heating options necessary for occupant detection and occupant classification. The circuits 122, 124, 126 and metallic conductive traces 132, 134, 136 of the figures are not exclusive, and as shown in FIG. 7, in some embodiments, the conductive traces 701A, 701B may be interleaved without touching for particular circuits on either side of the substrate 100.

The exploded view of FIG. 5 illustrates how metallic patterns 71, 72, 81 on opposite sides 110, 112 of the non-conductive sheet 100 can form the requisite sensing structures. In one non-limiting assembly, the sensor 500 may include the substrate 100, which is stretchable and electrically insulating as described above. On a first side 110, two circuit patterns 71, 72 may be arranged by printing conductive traces 132, 134 which may be similar to bendable conductive ink traces 141 of FIGS. 6A and 6B and configured as a respective resistive sensor circuit 122 and capacitive sensor circuit 124 on the substrate 100. On the second side 112, another pattern 81 of conductive ink traces 136 is formed for the shielding effect described above in a shield circuit 126. In the example of FIG. 5, the resistive, capacitive, and shielding ink traces have more than one layer. As shown, the substrate 100 supports a resistive sensor assembly 151 that incorporates at least two layers—a highly conductive deposit 153A and a moderately conductive second deposit 153B. The resistivity of each deposit 153A, 153B can be tailored to match specifications necessary for the use at hand. Also, on the first side 110 of the substrate 100, a capacitive sensor assembly 161 includes multiple layers formed on the first side 110, alongside but without touching the resistive sensor assembly 151. In another embodiment, a single trace may be used as the capacitive sensor and the resistive sensor in the same circuit. The capacitive sensor assembly includes a conductive patterned section 155A and an overlay section 155B. In one embodiment, the conductive patterned section 155A is a highly conductive pattern and the overlay section 155B is only moderately conductive. As noted above, the second side 112 of the substrate 110 also includes the shielding circuit 126 that can also incorporate a capacitive shield assembly 171, which, like the corresponding opposite layers, may have more than one layer in the shield assembly 171. FIG. 5 illustrates that capacitive shield assembly 171 has a highly conductive trace 136 forming a conductively patterned section 157A and a moderately conductive overlay layer 157B.

As noted, one aspect of a circuit construction 190 according to this disclosure is the ease with which the circuit construction 190 can be stretched for molding into a particular shape for a given application. In this regard, the non-conductive sheet 100 may be described as an elastic memory sheet having a sheet width dimension, sheet thickness dimension and a sheet length dimension along respective axes. Similarly, each of the patterns 71, 72, 81 have a corresponding, respective pattern width dimension and a respective pattern length dimension along respective axes. In one example that is not limiting of this disclosure, the sheet width dimension and the respective pattern width dimensions stretch and contract by an amount of 2 percent to 10 percent, simultaneously, in the presence of the deforming forces along a corresponding axis. Similarly, the sheet length dimension and said respective pattern length dimensions stretch and contract by an amount of 2 percent to 10 percent, simultaneously in the presence of the deforming forces along the other axis. Deforming forces on the sheet may include at least one of tensile forces, compressive forces, shear forces, and combinations thereof, such as forces used for installing or molding the circuit construction 190 for placement on or within a corresponding vehicle component (e.g., around a steering wheel, along an A-pillar or B-pillar, in a seat, or even on an accessory such as a glove compartment door, a parking brake, a visor, a head rest, or a dash board accessory of the vehicle).

The conductive traces 132, 134, and 136 of the circuit construction 190 form respective sensing circuits and shielding circuits on a single base sheet or substrate 100. The non-conductive nature of the sheet 100 prevents short circuits through the sheet and controls both a sensing capacitance and parasitic capacitance levels in a sensing operation. In one embodiment, the conductive traces 132, 134, and 136 are formed by printing, preferably, but not exclusively, screen printing, the conductive traces, and then either curing the conductive traces at a pre-defined temperature or letting the conductive traces dry on each side of the sheet before use. In this regard, all of the conductive traces on the opposite sides of the sheet form a solidified derivative structure of a fluidic and printable composition, such as a conductive ink. In one embodiment, the solidified derivative structure is a stretchable conductive ink, such as a silver polymer ink shown in FIG. 1. Other conductive traces (wiring, films, polymers, semiconductors, etc.) are also within the scope of this disclosure as technologies enable the same.

As noted, the circuit construction 190 is used for electrical sensing systems in a vehicle and may incorporate a base layer 100 in the form of a non-conductive sheet that is also flexible, conducive to forming multiple shapes, and can be stretched for placement on or within a vehicle component. The non-conductive sheet 100 may be a film that supports the conductive traces 132, 134, and 136 without allowing any short circuits through the sheets. The sheet may be a plastic film and may be selected from numerous polymeric materials including films selected from polyethylene terephthalate (PET), polyethylene naphthalate (PEN), polyimide plastics (PI), and combinations thereof. Other sheets may be more conducive to stretching as described above and be formed of a plastic film comprising a thermoplastic polyurethane film. The plastic film is impervious to a conductive ink used to form the conductive traces. In other embodiments, the non-conductive sheet may be a fabric, including at least one of woven fabrics, non-woven fabrics, and combinations thereof. For fabrics that would ordinarily absorb the conductive inks and cause bleed-through problems (and short circuits between the opposite sides 110, 112), the fabric may include a surface finish that enables screen printing and is resistant to the fabric absorbing a conductive ink used to form the respective traces. To accomplish a dual sided circuit on the substrate, fabric or a film has a sufficient surface energy to promote adhesion of the conductive traces.

The circuit construction 190 used for sensing circuits 122, 124 and shielding circuits 126 as discussed herein may be configured for manufacturing with printing processes that form the conductive traces thereon. The circuit construction for sensing and shielding may be on the same side of a single substrate or on opposite sides of a single substrate. In a method of forming the circuits on opposite sides of the same substrate 100, steps include applying respective fiducials to a first face 110 and a second face 112 of a flexible fabric, sheet, or film layer (base material substrate 100) to guide a printing process The sheet is held in place at a constant tension and maintained in stable dimensions for printing a first conductive trace 132 of a first pattern 71 on the first face 110 of the flexible base material, or substrate 100. The method further includes printing a second conductive trace 134 of a second pattern 72 on the opposite side 112 of the flexible base material, wherein the printing is completed according to a placement of the fiducials. The first and second patterns 71, 72 can be entirely distinct and non-overlapping from one another as shown in the figures, or the patterns can be similar or even identical so far as a general pattern is concerned. In one method, the fiducials are screen print fiducials and the printing is screen printing with a conductive ink. Prior to printing the second conductive trace, a manufacturing method includes applying at least one of the respective fiducials to the second face and screen printing the second conductive trace. Prior to applying the at least one of the respective fiducials, a step includes drying the first conductive trace and turning over the flexible fabric for further printing. Either side of the substrate 100 may also be printed accordingly with a third conductive trace, such as the above noted resistive sensor trace. In one optional step, the method further includes applying a carbon polymer or other moderately conductive coating to at least one side of the flexible fabric. Upon drying or firm placement of the first pattern 71 (resistive) and the second pattern 72 (capacitive), the same kinds of steps may proceed on the opposite side 112 to form the shielding layer traces 136 and the shielding pattern 81.

In a method of forming the circuits on one side of the same substrate 100, steps include applying respective fiducials to a first face 110 of a flexible fabric, sheet, or film layer (base material substrate 100) to guide a printing process. Next, the sheet is held in place at a constant tension and maintained in stable dimensions for printing a first conductive trace 132 of a first pattern 71 on the first face 110 of the flexible base material, or substrate 100. The method further includes printing a second conductive trace 134 of a second pattern 72 on the same side 110 of the flexible base material, wherein the printing is completed according to a placement of the fiducials. The first and second patterns 71, 72 can be entirely distinct and non-overlapping from one another as shown in the figures, or the patterns can be similar or even identical, without overlapping on the same side, so far as a general pattern is concerned. In one method, the fiducials are screen print fiducials and the printing is screen printing with a conductive ink. Prior to printing the second conductive trace, a manufacturing method includes repositioning and reapplying at least one of the respective fiducials to the first face and screen printing the second conductive trace. Prior to applying the at least one of the respective fiducials, a step includes drying the first conductive trace and turning the flexible fabric for further printing. The second side 112 of the substrate 100 may also be printed accordingly with a third conductive trace 136. The respective fiducials define the third conductive trace as a plurality of zones for shielding the resistive sensor circuit 122 and the capacitive sensor circuit 124 of a vehicle installed sensor system. In one optional step, the method further includes applying a carbon polymer or other moderately conductive coating to at least one side of the flexible fabric. Upon drying or firm placement of the first pattern 71 (resistive) and the second pattern 72 (capacitive), the same kinds of steps may proceed on the opposite side 112 to form the shielding layer traces 136 and the shielding pattern 81.

Figure 6B:
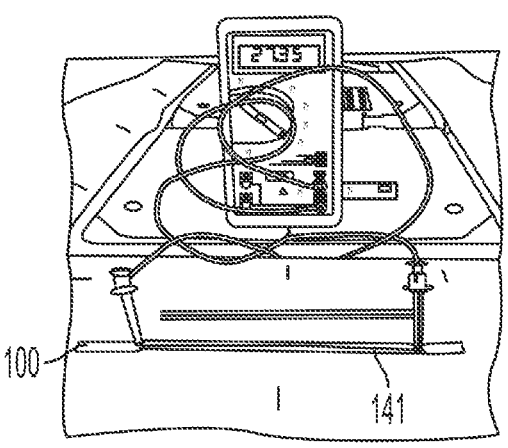
FIG. 6B illustrates a perspective view of the example circuit pattern of FIG. 6A printed onto a sensor mat with the force removed according to one implementation.
Figure 6C:
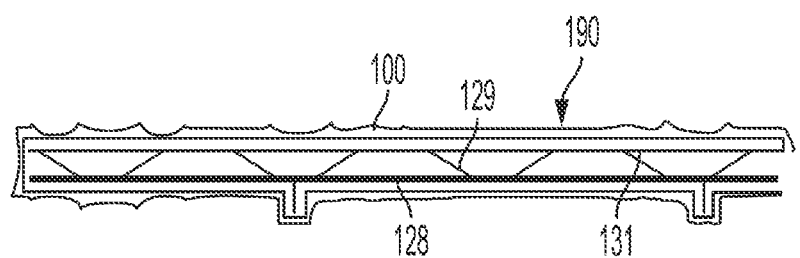
FIG. 6C illustrates a plan transparent view of layers of circuit patterns printed onto a sensor mat according to one implementation of this disclosure.
Figure 8A:
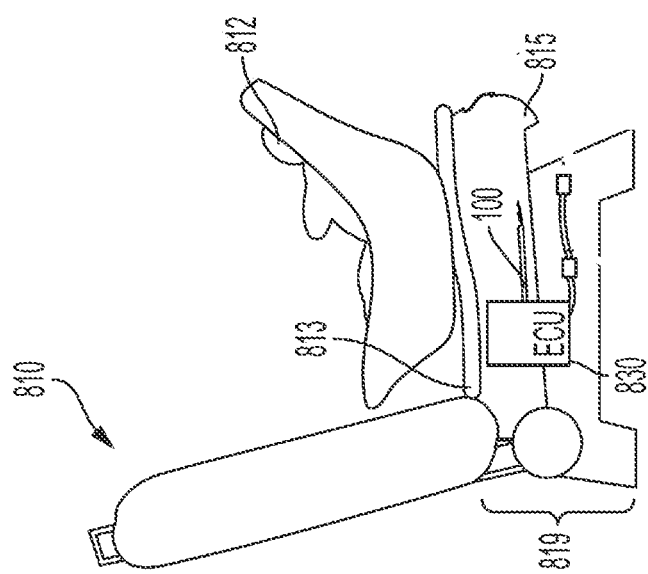
FIG. 8A illustrates a side plan view of a vehicle seat having a sensor as described herein installed below the seat surface.
Figure 8B:
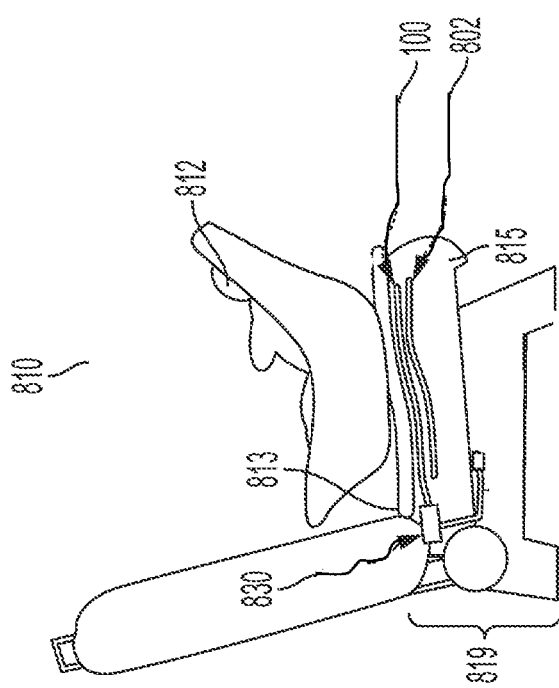
FIG. 8B illustrates a side plan view of a vehicle seat having a sensor as described herein installed below the seat surface.

Numerous installations of the sensor circuit construction 190 are available for use in a vehicle. FIGS. 8A and 8B illustrate example embodiments in which the sensor of this disclosure is installed in a vehicle seat assembly. As noted above and shown in FIG. 6A, the conductive ink traces 132, 134, and 136 are configured to bend in response to a deforming load (L) 143 applied to at least a portion of the conductive ink trace, and at least the resistive conductive ink trace 132 has an electrical resistance that fluctuates according to a degree of deformation of the conductive ink trace in response to the bend 143, as shown in FIGS. 6A and 6B. The deforming load may be a tensile force that stretches that conductive ink trace across the bend and/or a compressive force on the conductive ink trace due to the bend. The seat assembly 810 and the flexible substrate 100 and the conductive ink traces 132, 134, 136 are configured to withstand a respective deforming load that stretches or compresses across all dimensions of the flexible substrate and/or a respective conductive ink trace. This disclosure imposes no limits on the loading forces, such as the weight of an occupant, in magnitude or direction, other than natural considerations for the materials in use and the capacity of a subject vehicle.

The deforming load (L) may be applied from an exposed surface 813 of the seat assembly 810 through the deformable seat surface and toward the seat frame 819. For example, the deforming load may be a weight of an occupant 812 on the deformable seat surface 813. In many vehicle installations, the deformable seat surface is a porous cushion 815 of an original shape, and the porous cushion exhibits a structural memory that deforms toward the seat frame 819 in the presence of the deforming load. The seat cushion reverts to the original shape in the absence of the deforming load. The porous cushion exhibits a maximum degree of deformation for a respective magnitude of the deforming load that is less than the corresponding maximum degree of deformation exhibited by the flexible substrate 100 and the conductive ink traces 132, 134, and 136 under a same deforming load. The seat assembly 10 may, furthermore, include a plurality of the conductive ink traces 132, 134, 136 on respective flexible substrates 100 attached to numerous areas on the deformable seat surface, creating different zones for respectively identifiable data collection. The different positions for a substrate 100 having conductive ink traces 132, 134, 136 thereon exhibit respective tensile deformation or compressive deformation on each of the conductive ink traces in the presence of an occupant 812 on the deformable seat surface 813.

Figure 9:
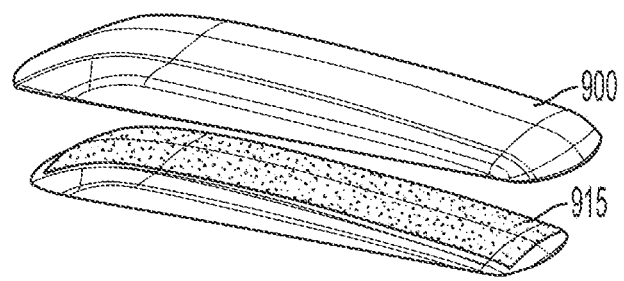
FIG. 9 illustrates an example embodiment of a sensor as described herein installed in an arm rest of a vehicle.

In one aspect of this disclosure, the tensile deformation and compressive deformation adjust the electrical resistance of the respective conductive ink traces, particularly the resistive sensor circuit 122 in accordance with the positions. The presence of an occupant, as well as the shape, size and location of the occupant, also influences the electric fields around the capacitive sensor circuits 124. These changes in physical parameters in each of the circuits of the sensor assembly 190 can be monitored to detect weight, occupant presence, the kind of occupant or object in a vehicle, and the like. In one embodiment, a voltage source attached to a first end of any one of the conductive ink traces and a computer 1000 having a processor 1002 and memory 1004 attached to the opposite end of the conductive ink traces, allow a computer 1000 to measure a change in resistance and/or capacitance of any given conductive ink trace due to the presence of the occupant. For a change in resistance on the resistive sensor assembly 151, the resistances may be processed to identify an occupant, a weight or size of an occupant, or whether the occupant is a living, dynamically moving object or a static object across a time period. This data can then be used to program safety features in a vehicle, such as, but not limited to, control systems for air bag activation, ignition start, and use of electronic accessories. The embodiments of a conductive trace on a flexible substrate as described herein are not limited only to seats and steering wheels, but may be installed on other vehicle components. In some embodiments, the installation 915 may be within an arm rest 900 (e.g., FIG. 9), a head rest, storage compartment lid, and other surfaces accessible from the seat assembly.

A substrate 100 with a conductive ink trace 132, 134, 136 as disclosed in this description may serve dual purposes, including heating subject surfaces in a vehicle when the resistance in the conductive trace 132, the resistive sensor layer, is sufficiently high. In the heating embodiments, a power source connected to the electronic control unit 830 is configured for selectively generating an electrical current through one or more resistive sensors to heat the circuit and serve as a seat heater.

In other embodiments, the shielding circuit may be configured as a part of a seat heater embodiment in which a voltage signal through one or more shielding circuits generates heat for the seat heating operation. An electronic control unit 830 may be used to alternate heating signals with shielding signals through the sensor assembly. The heating current is greater than a shielding current. For example, the heating current is around 4 to around 8 amperes, which is sufficient for producing heat for the seat, and the shielding current is less than about 200 milliamperes, which is sufficient for shielding the sensor mat from the seat frame, according to some implementations.

As shown in FIG. 8B, the installation of the substrate 100 may be more appropriately placed across portions of a seat frame 819 to sense an occupant presence relative to a seat position. In this installation, the substrate 100 operates as a strain gauge and exhibits changes in resistance and capacitance effects due to load forces thereon. This kind of data is also useful in monitoring occupants within a vehicle, particularly in terms of proper seat belt use.

As noted above, the conductive traces 132, 134, 136 on opposite sides of the substrate 100 can be connected to electrical circuits and used for capacitive sensing and shielding functions in the vehicle as part of occupant monitoring, safety systems, or accessory control systems in a vehicle. The shielding function may be illustrated as shown in FIG. 8A when a sensor of this disclosure is assembled within the seat cushion area and proximate a seat heater. In some non-limiting embodiments and only for example herein, a circuit construction 190 having a sensing circuit and a shielding circuit thereon may be used to shield the capacitive sensor circuit 124 and its layers from parasitic capacitance and deleterious field effects of the seat heater 802. By keeping the shield circuit 126 directly adjacent the sensor circuits 122, 124, the distance fluctuation between the two circuits is controlled by a known sheet thickness that does not vary widely because opportunities for thermal expansion and contraction are minimized.

An electronic control unit (ECU) 830, which is shown in FIGS. 8A and 8B, is in electronic communication with the seat heater shown in the figure, the sensor circuits 122, 124, the shield circuit 126, and one or more other vehicle systems (not shown). In particular, sensor return wires extend between the ECU 830 and each sensing circuit 122, 124, respectively and conveniently connect to the ECU 830 and various vehicle systems via a wire harness in the seat assembly. The ECU includes a processor and a power source.

In addition to being configured to detect presence of a driver's body, the sensing assemblies described herein may also be configured to detect various types of user input in each respective sensing zone, such as a grip, swipe motion, tap motion, etc., from signals received from the sensor mat. For example, by using a multi-zone sensor mat with sensing loops disposed in specific areas, the sensor mat may be configured for detecting the location of different occupants' and their body parts, seat belts, and the like The embodiments are not limited to only sensing a human, other animal or a given body part, but the circuit construction 190 has appropriate circuits to sense any conductive object whether a static, inanimate object that causes an electrical response in the circuits of the substrate or a living dynamic animal or human.

Embodiments of this disclosure include production and use of sensor circuit construction 190 and/or a sensor 500 alone. The sensor 500 may be utilized in numerous vehicle components or even in other industries all together. In one sensor embodiment, a sensor circuit construction 190 for occupant monitoring in a vehicle includes a flexible substrate 100 that is resilient to a deforming load thereon. A plurality of conductive traces 132, 134, 136 are on the flexible substrate 100, and the conductive traces are configured for bending in response to the deforming load applied to the flexible substrate 100 and the conductive traces 132, 134, 136. A resistive sensor circuit 122 is on a first side 110 of the flexible substrate, and the resistive sensor circuit 122 includes a respective set of the conductive traces, wherein the resistive sensor circuit has an electrical resistance that fluctuates according to a degree of deformation of the respective set of the conductive traces in response to the bending. In non-limiting embodiments, the substrate 100 includes a nonconductive substrate or even any single layer of insulating material. Other embodiments utilize a flexible substrate in the form of a non-conductive film. The non-conductive film may include at least one of polyethylene terephthalate (PET), polyethylene naphthalate (PEN), polyimide plastics (PI), a thermoplastic polyurethane, and combinations thereof.

In addition to the resistive sensor circuit 122 on the first side 110 of the flexible substrate, the sensor may have a capacitive sensor circuit 124 formed of a second set of conductive traces on the first side 110 of the flexible substrate 100. For certain non-limiting installations, the sensor 500 may further include a capacitive shield circuit 126 formed of a third set of the conductive traces on the second side 112 of the substrate 100. The resistive sensor circuit 122, the capacitive sensor circuit 124, and the capacitive shield circuit 126 include appropriate respective circuit connections and connection assemblies at a first end of at least one of said conductive traces and at an opposite end of said at least one of said conductive traces.

The sensor 500, along with its resistive sensor circuit 122, capacitive sensor circuit 124, and capacitive shield circuit 126, may include a plurality of conductive traces 132, 134, 136, and the conductive traces may be conductive ink traces. As described above, the plurality of conductive traces may be formed by screen printing processes to yield screen printed conductive traces. The plurality of conductive traces may include, without limitation, silver polymer ink. This disclosure includes numerous materials and methods of depositing and/or adhering the conductive traces 132, 134, 136 to the substrate. In some embodiments, the substrate 100 and the conductive traces 132, 134, 136 have a mutual resilience configured to allow the substrate and the conductive traces to stretch and contract in conjunction with one another without breaking the conductive traces. The physical properties of the conductive traces, materials used to form the conductive traces and the substrate, and the methods of manufacture of the sensor may be engineered to ensure that the substrate and the conductive traces have common physical properties, such as overlapping stretching performance parameters and deformation profiles in the presence of load forces. In this way, overlapping physical parameters, including stretching parameters, may provide a mutual resilience to deformation loads. In one non-limiting embodiment, the substrate and the conductive traces have a mutual resilience to withstand deforming forces that stretch a dimension of the sheet in any direction by an amount between 2 percent and 10 percent of an original dimension.

As shown in one example of FIG. 5, a sensor 500, includes an insulating substrate 100 that is flexible, stretchable, and/or deformable in accordance with this disclosure. The sensor 500 has a resistive sensor assembly 151 formed of a first set of conductive traces 153A, 153B on a first side 110 of the flexible substrate 100, a capacitive sensor circuit 161 formed of a second set of the conductive traces 155A, 155B on the first side 110 of the flexible substrate 100 and a capacitive shield circuit 171 formed of a third set of the conductive traces 157A, 157B on a second side 112 of the substrate. The resistive sensor circuit assembly 151, the capacitive sensor circuit assembly 161, and the capacitive shield circuit assembly 171 may, optionally, each have a plurality of layers or be formed of a single layer. In the non-limiting embodiment of FIG. 5, the resistive sensor circuit 151 includes a resistive circuit assembly having a highly conductive deposit layer 71 in the form of conductive trace 153A of a first conductivity and a moderately conductive deposit layer 73 in the form of conductive trace 153B of a second conductivity that is lower than the first conductivity. The capacitive sensor circuit 161 may include a multiple layer assembly formed alongside but without touching the resistive sensor circuit 151. The capacitive sensor circuit 161 includes a conductive patterned section 155A and an overlay section 155B. The conductive patterned section 155A includes a highly conductive pattern 72 having a respective conductivity, and the overlay section 155B includes a moderate conductivity pattern 74 that is lower than the respective conductivity of the highly conductive pattern 72. On the second side of the substrate 112, the capacitive shield circuit 171 includes a highly conductive trace 157A having a respective trace layer of a respectively high conductivity pattern 81 and an overlay layer 157B of a respectively moderate conductivity pattern 83 that is lower than the respectively high conductivity.

Furthermore, in sensor circuits having multiple zones, signals carried by sensor return wires associated with each sensing zone may generate noise in the sensing loops or sensor return wires associated with adjacent zones when the wires are too close to each other. This noise decreases the ability of the sensor mat to detect presence of an occupant adjacent one or more sensing zones. In addition, cross talk from a sensor return wire from one zone that crosses over another zone may result in unintended detection from another zone. Accordingly, various implementations described herein provide for shielding around at least a portion of the sensor return wires that may be disposed adjacent another sensing zone or sensor return wire to isolate the signal(s) carried by the sensor return wire(s).

Furthermore, biometric type sensors may be disposed in the vehicle to work in conjunction with hand sensing through the steering wheel using non-biometric type sensors. These biometric sensors may be disposed on the steering wheel or elsewhere in the vehicle. Examples of these biometric type sensors include retina detection, heart rate monitoring, arousal state monitoring, and driver detection (e.g., in a vehicle seat).

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," and "the" include plural referents unless the context clearly dictates otherwise. The term "comprising" and variations thereof as used herein is used synonymously with the term "including" and variations thereof and are open, non-limiting terms. While implementations will be described for steering wheel hand detection systems, it will become evident to those skilled in the art that the implementations are not limited thereto.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

It is important to note that the construction and arrangement of the sensing system as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting or layering arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present embodiments.

The figures utilize an exemplary computing environment in which example embodiments and aspects may be implemented. The computing device environment is only one example of a suitable computing environment and is not intended to suggest any limitation as to the scope of use or functionality.

Numerous other general purpose or special purpose computing devices environments or configurations may be used. Examples of well-known computing devices, environments, and/or configurations that may be suitable for use include, but are not limited to, personal computers, server computers, handheld or laptop devices, multiprocessor systems, microprocessor-based systems, network personal computers (PCs), minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

In its most basic configuration, a computing device typically includes at least one processing unit and memory. Depending on the exact configuration and type of computing device, memory may be volatile (such as random access memory (RAM)), non-volatile (such as read-only memory (ROM), flash memory, etc.), or some combination of the two.

Computing devices may have additional features/functionality. For example, computing device may include additional storage (removable and/or non-removable) including, but not limited to, magnetic or optical disks or tape. Such additional storage is illustrated in FIG. 10 by removable storage and non-removable storage.

Computing device typically includes a variety of computer readable media. Computer readable media can be any available media that can be accessed by the device and includes both volatile and non-volatile media, removable and non-removable media.

Computer storage media include volatile and non-volatile, and removable and non-removable media implemented in any method or technology for storage of information such as computer readable instructions, data structures, program modules or other data. Memory, removable storage, and non-removable storage are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device. Any such computer storage media may be part of computing device.

Figure 10:
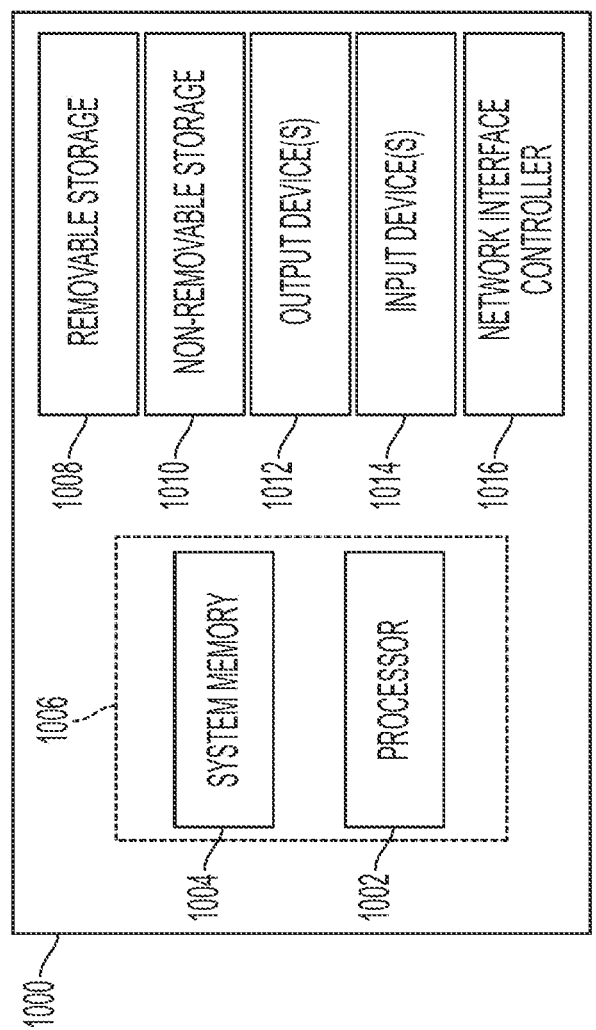
FIG. 10 illustrates a schematic view of a computer environment in which embodiments of this disclosure are implemented.

FIG. 10 illustrates one example computing environment that may implement data processing necessary in the embodiments of this disclosure. Computing device 1000 may contain communication connection(s) that allow the device to communicate with other devices. Computing device may also have input device(s) such as a keyboard, mouse, pen, voice input device, touch input device, etc. Output device(s) such as a display, speakers, printer, etc. may also be included. All these devices are well known in the art and need not be discussed at length here.

It should be understood that the various techniques described herein may be implemented in connection with hardware components or software components or, where appropriate, with a combination of both. Illustrative types of hardware components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. The methods and apparatus of the presently disclosed subject matter, or certain aspects or portions thereof, may take the form of program code (i.e., instructions) embodied in tangible media, such as CD-ROMs, hard drives, or any other machine-readable storage medium where, when the program code is loaded into and executed by a machine, such as a computer, the machine becomes an apparatus for practicing the presently disclosed subject matter.

FIG. 10 illustrates an example of a computer environment 1000 in which the above described electronic control unit 830 operates. In general, the ECU 830 is designated to control sensing and shielding operations as described above and process signals, whether power signals or data signals, received from and/or provided to the shield circuit and the sensor circuits. With the computer hardware 1006 including an appropriate processor 1002 and memory 1004, the ECU 830 can be configured with computer implemented software to ensure that the circuits in the overall shielding, sensing, and heating systems of this disclosure operate for the purposes described above. In one sense, the ECU 830 may be local to the circuit construction 190 of this disclosure, and in certain non-limiting embodiments, may include a somewhat basic configuration that is tailored to control only the sensing, shielding, and heating circuits in a substrate installation. This local ECU 830 may also be connected to a more global vehicle control system that implements a plurality of vehicle systems and accessories with more powerful hardware configurations, generally designated as a computerized vehicle data management system. It is notable that a vehicle-wide data management system will likely include system memory and processors, but will also incorporate more sophisticated kinds of memory devices, including removable storage 1008, non-removable storage 1010, multiple I/O connections 1012, 1014 for input devices and a network interface controller 1016 for diverse data communications throughout the vehicle. In this regard, the various components of computerized systems utilized for sensing technology herein are selected to transfer data or even power signals between source devices and recipient devices according to various implementations that tailored to the use at hand. In particular, the embodiments of this disclosure may utilize any kind of computer operations capable of network connection, including accessories such as human machine interface systems (e.g., touch pad(s), touch sensitive areas on a display, and/or switches for interfacing with one or more components on a data communications network handling occupant sensing and corresponding user communications).

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be configured across a plurality of devices.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A seat assembly for a vehicle comprising:
   a deformable seat surface connected to a seat frame;
   a flexible substrate positioned in proximity to the deformable seat surface in a position that a deforming load on the deformable seat surface transfers to the flexible substrate;
   at least one conductive ink trace on the flexible substrate, said at least one conductive ink trace configured to bend in response to the deforming load applied to at least a portion of the at least one conductive ink trace, and said at least one conductive ink trace having an electrical resistance that fluctuates according to a degree of deformation of the at least one conductive ink trace in response to the bend.

2. The seat assembly according to claim 1, wherein the deforming load is a tensile force that stretches the at least one conductive ink trace across the bend and/or a compressive force on the at least one conductive ink trace due to the bend.

3. The seat assembly according to claim 2, wherein said flexible substrate and said at least one conductive ink trace are configured to withstand a respective deforming load that stretches or compresses all dimensions of said flexible substrate and/or said at least one conductive ink trace in any direction.

4. The seat assembly of claim 1, wherein the deforming load is applied from an exposed surface of the seat assembly through the deformable seat surface and toward the seat frame.

5. The seat assembly of claim 4, wherein the deforming load is a weight of an occupant on the deformable seat surface.

6. The seat assembly of claim 1, wherein said deformable seat surface is a porous cushion of an original shape, said porous cushion exhibiting a structural memory that deforms toward the seat frame in the presence of the deforming load and reverts to the original shape in the absence of the deforming load, and wherein said porous cushion exhibits a maximum degree of deformation for a respective magnitude of the deforming load that is less than the corresponding maximum degree of deformation exhibited by the flexible substrate and the conductive ink under a same deforming load.

7. The seat assembly of claim 6, further comprising a plurality of said conductive ink traces on respective flexible substrates attached to areas on the deformable seat surface in positions that exhibit respective tensile deformation or compressive deformation on each of the conductive ink traces in the presence of an occupant on the deformable seat surface, wherein the tensile deformation and compressive deformation adjust the electrical resistance of the respective conductive ink traces in accordance with the positions.

8. The seat assembly of claim 1, further comprising a voltage source attached to a first end of said conductive ink trace and a computer having a processor and memory attached to the opposite end of the conductive ink trace, wherein said computer measures a change in resistance of the conductive ink trace due to the bend.

9. The seat assembly of claim 1, wherein the deformable seat surface is selected from the group consisting of an arm rest, a head rest, storage compartment lid, and other surfaces accessible from the seat assembly.

10. The seat assembly according to claim 1, further comprising a voltage source attached to a first end of said conductive ink trace and a computer having a processor and memory attached to an opposite end of the conductive ink trace, wherein said voltage source is configured to enable a heating function from the conductive ink trace.

11. The seat assembly of claim 1, wherein the deformable seat surface is a component in a suspension system of the seat assembly.

12. The seat assembly of claim 1, wherein the deformable seat surface is a component within the seat frame that deforms upon an occupant positioned on the seat assembly.

13. A system of occupant detection in a seat assembly of a vehicle, comprising:
   a deformable seat surface connected to a seat frame;
   a flexible substrate positioned to receive a deforming load from the deformable seat surface;
   at least one conductive ink trace on the flexible substrate, said conductive ink trace configured to bend in response to a deforming load applied to at least a portion of the conductive ink trace, and said conductive ink trace having an electrical resistance that fluctuates according to a degree of deformation of the conductive ink trace in response to the bend;
   a voltage source in electrical communication with a first end of said conductive ink trace;
   a computer having a processor and memory in data communication with the opposite end of the conductive ink trace, wherein said computer measures a change in resistance of the conductive ink trace due to the bend, and said computer is configured to classify the change in resistance as corresponding to a magnitude of the deforming load.

14. The system of claim 13, wherein the computer is further configured to classify the magnitude of the deforming load to a presence of an occupant in the seat assembly.

15. The system of claim 13, wherein the computer is further configured to classify the magnitude of the deforming load to a weight of an occupant in the seat assembly.

16. The system of claim 13, wherein the computer is further configured to classify a difference in impedance across the conductive ink trace according to a capacitive effect exhibited between an occupant in the seat assembly and the conductive traces.

17. The system of claim 13, wherein the substrate is a nonconductive substrate.

18. A sensor for occupant monitoring in a vehicle, comprising:
   a flexible substrate in proximity to a deformable seat surface;
   a plurality of conductive traces on the flexible substrate, said conductive traces configured to bend in response to a deforming load applied to the deformable seat surface and transferred through the deformable seat surface to at least a portion of the conductive traces, at least a first of said conductive traces forming a resistive sensor circuit on a first side of said flexible substrate, wherein said resistive sensor circuit has an electrical resistance that fluctuates according to a degree of deformation of the conductive ink trace in response to the bend;

a voltage source in electrical communication with a first end of said conductive traces;

a computer having a processor and memory in data communication with the opposite end of the conductive ink traces, wherein said computer measures a change in resistance of the resistive sensor circuit due to the bend, and said computer is configured to classify the change in resistance as corresponding to a magnitude of the deforming load.

19. The sensor according to claim 18, wherein a second conductive ink trace on said first side of said flexible substrate forms a capacitive sensor circuit on said flexible substrate.

20. The sensor according to claim 18, wherein the first of said conductive ink traces is configured as a resistive sensor circuit and a capacitive sensor circuit.

21. The sensor according to claim 18, wherein a third conductive ink trace is positioned on a second side of said flexible substrate, and said third conductive ink trace forms a shielding circuit on said flexible substrate.

* * * * *